(12) United States Patent
Kondo et al.

(10) Patent No.: US 8,465,670 B2
(45) Date of Patent: Jun. 18, 2013

(54) LIQUID CRYSTAL POLYESTER COMPOSITION AND ELECTRONIC CIRCUIT BOARD USING THE SAME

(75) Inventors: Takeshi Kondo, Tsukuba (JP); Sadanobu Iwase, Tsuchiura (JP); Hironobu Iyama, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 16 days.

(21) Appl. No.: 13/387,236

(22) PCT Filed: Jul. 23, 2010

(86) PCT No.: PCT/JP2010/062973
§ 371 (c)(1),
(2), (4) Date: Jan. 26, 2012

(87) PCT Pub. No.: WO2011/013831
PCT Pub. Date: Feb. 3, 2011

(65) Prior Publication Data
US 2012/0125673 A1   May 24, 2012

(30) Foreign Application Priority Data

Jul. 30, 2009  (JP) .................. 2009-177570

(51) Int. Cl.
| | | |
|---|---|---|
| *C09K 19/00* | (2006.01) | |
| *C09K 19/06* | (2006.01) | |
| *C09K 19/34* | (2006.01) | |
| *C09K 19/52* | (2006.01) | |
| *H05K 1/00* | (2006.01) | |

(52) U.S. Cl.
USPC .................. 252/299.01; 252/299.6; 428/1.1; 428/1.3; 174/250; 174/256; 174/258

(58) Field of Classification Search
USPC ..... 252/299.01, 299.6; 428/1.1, 1.3; 174/250, 174/256, 258
See application file for complete search history.

(56) References Cited

U.S. PATENT DOCUMENTS
8,029,694 B2 * 10/2011  Saga ........................ 252/299.01

\* cited by examiner

*Primary Examiner* — Geraldina Visconti
(74) *Attorney, Agent, or Firm* — Foley & Lardner LLP

(57) ABSTRACT

To provide a liquid crystal polyester composition which is suited for use as a material for forming a liquid crystal polyester film having excellent thermal conductivity. Also, an excellent electronic circuit board is provided by using an insulating film obtained from the liquid crystal polyester composition. The liquid crystal polyester composition of the present invention is composed of a liquid crystal polyester, a solvent and a thermally conductive filler. The thermally conductive filler is contained in the amount of 50 to 90 volume % based on the total amount of the liquid crystal polyester and the thermally conductive filler, and the thermally conductive filler contains 0 to 20 volume % of a first thermally conductive filler having a volume average particle diameter of 0.1 μm or more and less than 1.0 μm, 5 to 40 volume % of a second thermally conductive filler having a volume average particle diameter of 1.0 μm or more and less than 5.0 μm and 40 to 90 volume % of a third thermally conductive filler having a volume average particle diameter of 5.0 μm or more and 30.0 μm or less.

6 Claims, 1 Drawing Sheet

LIQUID CRYSTAL POLYESTER COMPOSITION AND ELECTRONIC CIRCUIT BOARD USING THE SAME

TECHNICAL FIELD

The present invention relates to a liquid crystal polyester composition and an electronic circuit board using the same, and more particularly to an insulating film using the liquid crystal polyester composition, and improvement of thermal conductivity of electronic circuit board.

BACKGROUND ART

Heretofore, an electronic circuit board using an insulating material has been known. FIG. 2 is a sectional view showing a structure example of such an electronic circuit board 300. In the electronic circuit board shown in FIG. 2, an insulating film 302 is formed on a metal base 301, and also a conductive foil 303 as a wiring pattern is formed thereon. On the electronic circuit board 300, a mounted circuit 304 is formed using electronic components such as an integrated circuit (IC). The respective electronic components are electrically connected to a wiring pattern formed of the conductive foil 303. The mounted circuit 304 generates heat at the time of an operation. This heat is directly radiated from IC or the like, or transmitted to a metal base 301 through the insulating film 302 and is also radiated from the metal base 301. Therefore, in the electronic circuit board using the metal base 301, high heat radiation effect can be obtained.

In order to sufficiently exert the heat radiation effect of the metal base 301, it is desired to sufficiently increase thermal conductivity of the insulating film 302. It is also required for the insulating film 302 to have sufficient performances with respect to heat resistance and adhesion to the conductive foil 303.

The liquid crystal polyester has attracted special interest as an insulating film forming material for an electronic circuit board since it has low hygroscopicity, in addition to high thermal conductivity and excellent heat resistance. An electronic circuit board using a liquid crystal polyester film is described, for example, in JP-B-6-82893, JP-A-2004-315678 and JP-B-5-71630.

JP-B-6-82893 discloses a method in which a mixture of a liquid crystal polyester and a filler is formed into a sheet through extrusion molding to form a flat sheet, and then copper is laminated on a surface of the flat sheet to produce a printed circuit board (refer to lines 17 to 44 of left column on page 12 of JP-B-6-82893).

JP-A-2004-315678 discloses a technique in which corrosion resistance of a liquid crystal polyester solution is improved by dissolving a liquid crystal polyester containing 10 to 35 mol % of a structural unit derived from an aromatic diamine in an aprotic solvent, and a method in which anisotropy and mechanical strength of a liquid crystal polyester film for an electronic circuit board are improved by removing a solvent from a cast of this solution (refer to columns 0002 and 0039 of JP-A-2004-315678).

JP-B-5-71630 discloses a method in which thermal conductivity of a liquid crystal polyester is improved by including an insulating inorganic powder having high thermal conductivity such as an alumina powder or a magnesium powder, thereby improving heat radiation properties of a circuit board (refer to lines 24 to 39 of right column on page 10 of JP-B-5-71630).

DISCLOSURE OF THE INVENTION

However, it is difficult for the method in JP-B-6-82893 to form a thin insulating film having a thickness of about 100 to 200 μm using a liquid crystal polyester since an extrusion molding method is used. This is because the liquid crystal polyester has high viscosity. However, a thin film is required as an insulating film which is used for the above-mentioned electronic circuit board using a metal base. This is because that as the thickness of the film decreases, heat resistance of the film decreases, and thus making it possible to enhance thermal conductivity between the metal foil 303 or the mounted circuit 304 and the metal base 301. The liquid crystal polyester film disclosed in Example 1 of JP-B-6-82893 has an extrusion thickness of 0.4 mm and thermal conductivity of 1.5 W/(m·K) (W is "watt", m is "meter", K is "kelvin", the same shall n apply hereinafter). However, these values are insufficient for an electronic circuit board using a metal base.

Furthermore, when a liquid crystal polyester film is produced by an extrusion molding method, the liquid crystal polyester film is markedly oriented in the extrusion direction. Therefore, the thermal conductivity increases in an extrusion direction (i.e. direction parallel to a film surface) and may decrease in a film thickness direction.

In contrast, in an electronic circuit board 300, it is necessary that heat is propagated in a thickness direction of the insulating film 302. Also in this respect, the liquid crystal polyester film produced by the extrusion molding method is not suited for use as an insulating film which is used for an electronic circuit board using a metal base.

The liquid crystal polyester film according to JP-A-2004-315678 had a drawback that sufficiently high thermal conductivity cannot be obtained.

In contrast, in JP-B-5-71630, the thermal conductivity of the liquid crystal polyester film is improved by filling an inorganic powder such as alumina. According to the method of JP-B-5-71630, the thermal conductivity increases as the filling amount of the inorganic powder increases. However, when the content of the inorganic powder increases too much, defects such as voids occur inside the film, and thus it becomes difficult to improve the thermal conductivity. Therefore, it is estimated that the limit of the amount of the inorganic powder to be filled into the liquid crystal polyester is about 60 volume %, and there is a limitation on the improvement in thermal conductivity.

An object of the present invention is to provide a liquid crystal polyester composition which is suited for use as a material for forming a liquid crystal polyester film having excellent thermal conductivity.

In order to achieve such an object, the present inventors have studied about a liquid crystal polyester composition containing a liquid crystal polyester, a solvent and a thermally conductive filler, and thus the present invention has been completed.

That is, the present invention provides a liquid crystal polyester composition including a liquid crystal polyester, a solvent and a thermally conductive filler, wherein the content of the thermally conductive filler is from 50 to 90 volume % based on the total amount of the liquid crystal polyester and the thermally conductive filler, and the liquid crystal polyester composition contains, as the thermally conductive filler, 0 to 20 volume % of a first thermally conductive filler having a volume average particle diameter of 0.1 μm or more and less than 1.0 μm, 5 to 40 volume % of a second thermally conductive filler having a volume average particle diameter of 1.0 μm or more and less than 5.0 μm and 40 to 90 volume % of a third thermally conductive filler having a volume average particle diameter of 5.0 μm or more and 30.0 μm or less.

The present invention also provides an electronic circuit board including a substrate for heat radiation, an insulating film provided on the substrate for heat radiation and a conductive foil for formation of a wiring pattern provided on the insulating film, wherein the insulating film is a film formed by removing a solvent from a cast of the above liquid crystal polyester composition.

According to the present invention, it is possible to improve thermal conductivity of the obtained liquid crystal polyester film as compared with the prior art by using, as a thermally conductive filler, 0 to 20 volume % of a first thermally conductive filler having a volume average particle diameter of 0.1 μm or more and less than 1.0 μm, 5 to 40 volume % of a second thermally conductive filler having a volume average particle diameter of 1.0 μm or more and less than 5.0 μm and 40 to 90 volume % of a third thermally conductive filler having a volume average particle diameter of 5.0 μm or more and 30.0 μm or less in a liquid crystal polyester composition containing a liquid crystal polyester, a solvent and a thermally conductive filler.

Use of a film formed using the above liquid crystal polyester composition in the present invention, as an insulating film, enables enhanced heat radiation effect of the obtained electronic circuit board, and also enables satisfactory heat resistance of the insulating film and tight adhesion to a conductive foil.

MODE FOR CARRYING OUT THE INVENTION

The liquid crystal polyester composition in the present invention contains a liquid crystal polyester, a solvent and a thermally conductive filler. The liquid crystal polyester composition according to an embodiment of the present invention, and an electronic circuit board using the same will be described below.

<Structure of Electronic Circuit Board>

FIG. 1 is a conceptual sectional view showing a structure of an electronic circuit board 100 according to an example of the present invention.

As shown in FIG. 1, the electronic circuit board 100 has a laminated structure including a metal base 101, a liquid crystal polyester film 102 and a metal foil 103.

The metal base 101 is, for example, a metal plate of aluminum, copper, stainless steel or the like, or an alloy thereof or the like. It is possible to use, as the metal base 101, the same metal base as that of a conventional electronic circuit board. The thickness of the metal base 101 is, for example, 2.0 mm. The metal base 101 is not necessarily a flat sheet and, for example, it can be bent.

It is possible to use, as the liquid crystal polyester film 102, a liquid crystal polyester film obtained by using a liquid crystal polyester composition in the present invention. As mentioned below, the liquid crystal polyester film 102 contains thermally conductive fillers A, B and C (first, second and third thermally conductive fillers) each having a different volume average particle diameter. The thickness of the liquid crystal polyester film 102 is, for example, 200 μm.

For example, a copper foil or the like is used as the metal foil 103. On the metal foil 103, for example, a wiring pattern of a circuit may be formed by etching or the like. Then, it is possible to mount the same electronic components as those in case of a conventional substrate shown in FIG. 2 (not shown in FIG. 1) on the electronic circuit board 100 using this wiring pattern. It is possible to use, as the metal foil 103, the same metal foil as that in case of a conventional electronic circuit board. The thickness of the metal foil 103 is, for example, 70 μm.

<Liquid Crystal Polyester>

The liquid crystal polyester used in the present invention is preferably a liquid crystal polyester which exhibits optical anisotropy at the time of melting, and forms an anisotropic melt at a temperature of 450° C. or lower. It is preferred that the liquid crystal polyester of the present embodiment includes structural units represented by the following formulas (1), (2) and (3) as structural units, and that the content of the structural unit represented by the formula (1) is from 30 to 80 mol %, the content of the structural unit represented by the formula (2) is from 35 to 10 mol %, and the content of the structural unit represented by the formula (3) is from 35 to 10 mol %:

  (1)

  (2)

  (3)

wherein $Ar_1$ represents 1,4-phenylene, 2,6-naphthalene or 4,4'-biphenylene, $Ar_2$ represents 1,4-phenylene, 1,3-phenylene or 2,6-naphthalene, $Ar_a$ represents 1,4-phenylene or 1,3-phenylene, X represents —NH—, and Y represents —O— or —NH—.

The structural unit (1) is a structural unit derived from an aromatic hydroxy acid, the structural unit (2) is a structural unit derived from an aromatic dicarboxylic acid, and the structural unit (3) is a structural unit derived from an aromatic diamine, an aromatic amine having a hydroxyl group and an aromatic amino acid. In place of them, an ester forming derivative thereof may be used.

Examples of the ester forming derivative of the carboxylic acid include acid chloride in which a carboxyl group accelerates a reaction of forming a polyester, a derivative having high reaction activity such as acid anhydride, alcohols in which a carboxyl group forms a polyester through an ester exchange reaction, those which forms an ester with ethylene glycol and the like.

Examples of the ester forming derivative of the phenolic hydroxyl group include those in which a phenolic hydroxyl group forms an ester with carboxylic acids so as to form a polyester through an ester exchange reaction.

Examples of the ester forming derivative of the amino group include those in which an amino group forms an ester with carboxylic acids so as to form a polyester through an ester exchange reaction.

Examples of the repeating structural unit of the liquid crystal polyester used in the present invention include, but are not limited to, the followings.

Examples of the structural unit (1) include structural units derived from p-hydroxybenzoic acid, 2-hydroxy-6-naphthoic acid and 4-hydroxy-4'-biphenylcarboxylic acid, and two or more kinds of the structural units may be included in the total structural units. Among these structural units, a liquid crystal polyester including a structural unit derived from 2-hydroxy-6-naphthoic acid is preferably used. The content of the structural unit (1) is preferably from 30 to 80 mol %, more preferably from 40 to 70 mol %, and still more preferably from 45 to 65 mol %, based on the total structural units. When the content of the structural unit (1) is more than 80 mol %, solubility may drastically decrease. When the content is less than 30 mol %, mesomorphism may not be exhibited.

Examples of the structural unit (2) include structural units derived from terephthalic acid, isophthalic acid and 2,6-naphthalenedicarboxylic acid, and two or more kinds of the structural units may be included in the total structural units. It is preferred to use a liquid crystal polyester including a structural unit derived from isophthalic acid among these structural units from the viewpoint of solubility. The content of the structural unit (2) is preferably from 35 to 10 mol %, more preferably from 30 to 15 mol %, and still more preferably from 27.5 to 17.5 mol %, based on the total structural units. When the content of the structural unit (2) is more than 35 mol %, mesomorphism may deteriorate. When the content is less than 10 mol %, solubility may decrease.

Examples of the structural unit (3) include structural units derived from 3-aminophenol, 4-aminophenol, 1,4-phenylenediamine, 1,3-phenylenediamine and aminobenzoic acid, and two or more kinds of the structural units may be included in the total structural units. It is preferred to use a liquid crystal polyester including a structural unit derived from 4-aminophenol among these structural units from the viewpoint of reactivity. The content of the structural unit (3) is preferably from 35 to 10 mol %, more preferably from 30 to 15 mol %, and still more preferably from 27.5 to 17.5 mol %, based on the total structural units. When the content of the structural unit (3) is more than 35 mol %, mesomorphism may deteriorate. When the content is less than 10 mold, solubility may decrease.

The structural unit (3) is preferably used in substantially the same amount as that of the structural unit (2). When the content of the structural unit (3) accounts for −10 mol % to +10 mol % of the content of the structural unit (2), it is possible to control the polymerization degree of the liquid crystal polyester.

There is no particular limitation on the method for producing a liquid crystal polyester used in the present invention, and examples thereof include a method in which a phenolic hydroxyl group and an amino group of an aromatic hydroxy acid corresponding to the structural unit (1), aromatic amine and aromatic diamine each having a hydroxyl group corresponding to the constituent unit (3) are acylated with an excess amount of fatty acid anhydride to obtain an acylate, and the obtained acylate and an aromatic dicarboxylic acid corresponding to the structural unit (2) are subjected to melt polymerization through transesterification (polycondensation) and the like.

A fatty acid ester obtained by acylation in advance may be used as the acylate (refer to JP-A-2002-220444 and JP-A-2002-146003

In the acylation reaction, the addition amount of the fatty acid anhydride is preferably from 1.0 to 1.2-fold equivalents, more preferably from 1.05 to 1.1-fold equivalents, based on the total amount of a phenolic hydroxyl group and an amino group. When the addition amount of the fatty acid anhydride is less than 1.0-fold equivalents, the acylate, raw monomer and the like may undergo sublimation at the time of transesterification (polycondensation) and thus a reaction system is likely to cause clogging. When the addition amount is more than 1.2-fold equivalents, the obtained liquid crystal polyester may cause drastic coloration.

The acylation reaction is preferably carried out at 130 to 180° C. for 5 minutes to 10 hours, and more preferably at 140 to 160° C. for 10 minutes to 3 hours.

There is no particular limitation on the fatty acid anhydride used in the acylation reaction, and examples thereof include acetic anhydride, propionic anhydride, butyric anhydride, isobutyric anhydride, valeric anhydride, pivalic anhydride, diethylhexanoic anhydride, monochloroacetic anhydride, dichloroacetic anhydride, trichloroacetic anhydride, monobromoacetic anhydride, dibromoacetic anhydride, tribromoacetic anhydride, monofluoroacetic anhydride, difluoroacetic anhydride, trifluoroacetic anhydride, glutaric anhydride, maleic anhydride, succinic anhydride, β-bromopropionic anhydride and the like. A mixture of two or more kinds of these fatty acid anhydrides may be used. From the viewpoint of costs and handling properties, acetic anhydride, propionic anhydride, butyric anhydride, isobutyric anhydride are preferable, and acetic anhydride is more preferable.

In the transesterification, the amount of the acyl group of acylate is preferably from 0.8 to 1.2-fold equivalents based on the carboxyl group.

Transesterification is preferably carried out while raising the temperature at 130 to 400° C. at a rate of 0.1 to 50° C./minute, and more preferably carried out while raising the temperature at 150 to 350° C. at a rate of 0.3 to 5° C./minute.

When fatty acid ester obtained by acylation is transesterified with carboxylic acid, the by-produced fatty acid and the unreacted fatty acid anhydride are preferably distilled out of the system by vaporization so as to transfer equilibrium.

The acylation reaction and transesterification may be carried out in the presence of a catalyst. It is possible to use, as the catalyst, those which have hitherto been known as a catalyst for polymerization of a polyester. Examples thereof include metal salt catalysts such as magnesium acetate, stannous acetate, tetrabutyl titanate, lead acetate, sodium acetate, potassium acetate and antimony trioxide; organic compound catalysts such as N,N-dimethylaminopyridine and N-methylimidazole; and the like.

Among these catalysts, heterocyclic compound having two or more nitrogen atoms, such as N,N-dimethylaminopyridine and N-methylimidazole are preferably used (refer to JP-A-2002-146003)

Such a catalyst is usually charged at the time of charging monomers and it is not necessarily removed even after acylation. When the catalyst is not removed, transesterification can be carried out as it is.

Polycondensation through transesterification is usually carried out by melt polymerization, and melt polymerization and solid phase polymerization may be used in combination. The solid phase polymerization is preferably carried out by a known solid phase polymerization method after extracting a polymer from the melt polymerization step and crushing to thereby form into a powder or a flake. Specific examples include a method in which a heat treatment is carried out under an inert atmosphere such as nitrogen at 20 to 350° C. for 1 to 30 hours in a solid phase state. The solid phase polymerization may be carried out with or without stirring in a standing state. It is also possible to use a melt polymerization tank and a solid phase polymerization tank as the same reaction vessel by providing with an appropriate stirring mechanism. After the solid phase polymerization, the obtained liquid crystal polyester may be pelletized and formed by a known method.

The liquid crystal polyester can be produced, for example, by using a batchwise device, a continuous device or the like.

<Solvent>

The solvent used in the liquid crystal polyester composition of the present invention is preferably an aprotic solvent. There is no particular limitation on the use amount of the solvent, as long as a liquid crystal polyester can be dissolved and the use amount can be appropriately selected according to applications. The liquid crystal polyester is preferably used in the amount of 0.01 to 100 parts by weight based on 100 parts by weight of the solvent. When the use amount of the liquid crystal polyester is less than 0.01 part by weight, it may be impossible to uniformly apply because of too low solution viscosity. When the use amount is more than 100 parts by weight, viscosity may increases. From the viewpoint of workability and economical efficiency, the use amount of the liquid crystal polyester is more preferably form 1 to 50 parts by weight, and still more preferably from 2 to 40 parts by weight, based on 100 parts by weight of the solvent.

Examples of the aprotic solvents include halogen-based solvents such as 1-chlorobutane, chlorobenzene, 1,1-dichloroethane, 1,2-dichloroethane, chloroform and 1,1,2,2-tetrachloroethane; ether-based solvents such as diethylether, tetrahydrofuran and 1,4-dioxane; ketone-based solvents such as acetone and cyclohexanone; ester-based solvents such as ethyl acetate; lactone-based solvents such as γ-butyrolactone; carbonate-based solvents such as ethylene carbonate and propylene carbonate; amine-based solvents such as triethylamine and pyridine; nitrile-based solvents such as acetonitrile and succinonitrile; amide-based solvents such as N,N'-dimethylformamide, N,N'-dimethylacetamide, tetramethylurea and N-methyl pyrrolidone; nitro-based solvents such as nitromethane and nitrobenzene; sulfide-based solvents such as dimethyl sulfoxide and sulfolane; phosphoric acid-based solvents such as hexamethylphosphoric acid amide and tri-n-butylphosphoric acid; and the like.

Among these aprotic solvents, a solvent containing no halogen atom is preferably used from the viewpoint of an influence on the environment, and a solvent having a dipole moment of 3 or more and 5 or less is preferably used from the viewpoint of solubility. Specifically, amide-based solvents such as N,N'-dimethylformamide, N,N'-dimethylacetamide, tetramethylurea and N-methyl pyrrolidone; and lactone-based solvents such as γ-butyrolactone are more preferably used, and N,N'-dimethylformamide, N,N'-dimethylacetamide and N-methyl pyrrolidone are still more preferably used.

<Thermally Conductive Filler>

As described above, in the present embodiment, the liquid crystal polyester composition contains a thermally conductive filler A (first thermally conductive filler), a thermally conductive filler B (second thermally conductive filler) and a thermally conductive filler C (third thermally conductive filler), each having a different volume average particle diameter.

The total content of thermally conductive fillers A, B and C is desirably adjusted within a range from 50 to 90 volume % based on the total amount of the liquid crystal polyester and the thermally conductive filler for the following reason. When the thermally conductive fillers A, B and C are used in a predetermined ratio, even if the content of the thermally conductive filler is large, defects such as voids are less likely to occur inside the film and thus thermal conductivity can be improved.

A powder having a volume average particle diameter of 0.1 μm or more and less than 1.0 μm is selected as the thermally conductive filler A (first thermally conductive filler). The content of the thermally conductive filler A in the liquid crystal polyester composition of the present invention is from 0 to 20 volume % based on the total content of the thermally conductive fillers A, B and C.

A powder having a volume average particle diameter of 1.0 μm or more and less than 5.0 μm is selected as the thermally conductive filler B (second thermally conductive filler). The content of the thermally conductive filler B in the liquid crystal polyester composition of the present invention is from 5 to 40 volume % based on the total content of the thermally conductive fillers A, B and C.

A powder having a volume average particle diameter of 5.0 μm or more and 30.0 μm or less is used as the thermally conductive filler C (third thermally conductive filler). The content of the thermally conductive filler C in the liquid crystal polyester composition of the present invention is from 40 to 90 volume % based on the total content of the thermally conductive fillers A, B and C.

Those having the conductivity of usually 10 W/(m·K) or more, and preferably 30 W/(m·K) or more, are preferably used as the thermally conductive filler. For example, it is possible to use one kind, or two or more kinds of compound(s) selected from metal oxide, metal nitride and metal carbide can be used. The thermally conductive filler is preferably selected from oxide, nitride and carbide of elements up to each 7th line of groups II, III and IV of the Periodic Table. Specifically, it is possible to use one or more kinds of beryllium oxide, magnesium oxide, aluminum oxide, thorium oxide, zinc oxide, silicon nitride, boron nitride, alumina nitride and silicon carbide.

From the viewpoint of increasing thermal conductivity, it is particularly preferable to use aluminum oxide or aluminum nitride as the thermally conductive fillers A, B and C.

All thermally conductive fillers A, B and C may be made of the same kind of a compound or may be made of different kinds of compounds.

It is possible to adjust the thermal conductivity of the liquid crystal polyester film within a range from 6 to 20 W/(m·K) by using these thermally conductive fillers A, and C.

<Other Components>

As described above, in the present embodiment, the liquid crystal polyester composition contains two or three kinds of thermally conductive fillers A, B and C, each having a different average particle diameter. In the present embodiment, the liquid crystal polyester composition may contain other fillers, for example, known fillers, additives and the like, as long as the objects of the present invention are not impaired.

Examples of the filler include organic fillers such as an epoxy resin powder, a melamine resin powder, a urea resin powder, a benzoguanamine resin powder and a styrene resin; inorganic fillers such as silica, alumina, titanium oxide, zirconia, kaolin, calcium carbonate and calcium phosphate; and the like.

Examples of the additive include a known coupling agent, an antisettling agent, an ultraviolet absorber, a thermal stabilizer and the like.

As long as the objects of the present invention are not impaired, the liquid crystal polyester composition may contain one kind, or two or more kinds of thermoplastic resins such as polypropylene, polyamide, polyester, polyphenylenesulfide, polyetherketone, poly carbonate, polyethersulfone, polyphenylether and a modified product thereof, and polyetherimide; elastomers such as a copolymer of glycidyl methacrylate and polyethylene; and the like.

<Liquid Crystal Polyester Film>

The liquid crystal polyester film in the present invention can be obtained by optionally filtering a solution obtained by dissolving a liquid crystal polyester in a solvent through a filter or the like to remove fine foreign matters contained in the solution; adding a thermally conductive filler to obtain a liquid crystal polyester composition; casting the obtained liquid crystal polyester composition onto a supporting base material (a metal base 101 or a metal foil 103 can be used in the present embodiment) so that the surface becomes flat and uniform, using various means such as a roller coating method, a dip coating method, a spray coating method, a spinner coating method, a curtain coating method, a slot coating method and a screen printing method; and then removing the solvent.

There is no particular limitation on the method of removing a solvent, and the solvent is preferably removed by vaporization of the solvent. Examples of the method of vaporizing the solvent include heating, decompression, ventilation methods and the like. Among these methods, a method of vaporizing by heating is preferably from the viewpoint of productive efficiency and handling properties, and a method of vaporizing by heating while ventilation is more preferable. At this time, the heating condition preferably includes the step of pre-drying at 60 to 200° C. for 10 minutes to 2 hours and the step of carrying out a heat treatment at 200 to 400° C. for 30 minutes to 5 hours.

There is no particular limitation on the thickness of the thus obtained liquid crystal polyester film, and the thickness is preferably from 0.5 to 500 μm from the viewpoint of film forming properties and mechanical properties, and more preferably 200 μm or less from the viewpoint of suppressing thermal resistance to low thermal resistance.

The liquid crystal polyester composition of the present invention exhibits low corrosiveness and is easy to handle, and a film obtained by using the composition exhibits small anisotropy in a longitudinal direction (casting direction) and a lateral direction (direction vertical to a casting direction) and is excellent in mechanical strength, and is also excellent in performances peculiar to the liquid crystal polyester, such as high frequency property and low water absorption property. Therefore, the film is not only suitable for an electronic circuit board of the present embodiment, but also for an insulating film for another electronic components.

As used herein, the term "film" includes a film ranging from a sheet-like very thin film to a thick film, and the form thereof includes not only a sheet-like form but also bottle-shaped container form.

EXAMPLES

The liquid crystal polyester resin composition and the electronic circuit board of the present invention, and the evaluation results thereof will be described below by way of Examples, but the present invention is not limited to the following Examples.

(1) Production of Liquid Crystal Polyester

In a reactor equipped with a stirrer, a torque meter, a nitrogen gas introducing tube, a thermometer and a reflux condenser, 1,976 g (10.5 mol) of 2-hydroxy-6-naphthoic acid, 1,474 g (9.75 mol) of 4-hydroxyacetoanilide, 1,620 g (9.75 mol) of isophthalic acid and 2,374 g (23.25 mol) of acetic anhydride were charged. After sufficiently replacing the gas in the reactor by a nitrogen gas, the temperature was raised to 150° C. over 15 minutes under a nitrogen gas flow and the mixture was refluxed while maintaining the same temperature for 3 hours.

Then, while distilling off the distilled by-produced acetic acid and the unreacted acetic anhydride, the temperature was raised to 300° C. over 170 minutes. At the time when an increase in torque is recognized was regarded as completion of the reaction, and contents were extracted. The thus extracted contents were cooled to room temperature and crushed by a crusher to obtain a liquid crystal polyester powder having comparatively low molecular weight. With respect to the thus obtained powder, the flow initiation temperature was measured by Flow Tester "Model CFT-500" (manufactured by Shimadzu Corporation). As a result, it was 235° C. Solid phase polymerization was carried out by heat-treating the liquid crystal polyester powder under a nitrogen atmosphere at 223° C. for 3 hours. After the solid phase polymerization, the liquid crystal polyester showed a flow initiation temperature of 270° C.

(2) Production of Liquid Crystal Polyester Solution

The liquid crystal polyester (2,200 g) obtained in the above (1) was added to N,N-dimethylacetamide (DMAc) (7,800 g), followed by heating at 100° C. for 2 hours to obtain a liquid crystal polyester solution. This solution showed a solution viscosity of 320 cP (centipoises). This viscosity value is the value obtained by measuring at a measuring temperature of 23° C., using a B type viscometer "Model TVL-20" (rotor No. 21 (rotational speed of 5 rpm), manufactured by Toki Sangyo Co., Ltd.).

(3) Production of Electronic Circuit Board

Example 1

A spherical α-alumina powder having a volume average particle diameter of 0.3 μm ("SUMICORUNDUM AA-0.3", manufactured by Sumitomo Chemical Company, Limited.) was used as a first thermally conductive filler and a spherical α-alumina powder having a volume average particle diameter of 1.5 μm ("SUMICORUNDUM AA-1.5", manufactured by Sumitomo to Chemical Company, Limited.) was used as a second thermally conductive filler, and a spherical α-alumina powder having a volume average particle diameter of 18 μm ("SUMICORUNDUM AA-18", manufactured by Sumitomo Chemical Company, Limited.) was used as a third thermally conductive filler.

A thermally conductive filler was added to the liquid crystal polyester solution (solid content of 22% by weight) obtained in the above (2). Herein, the filling amount of the thermally conductive filler was adjusted to 70 volume % based on the total amount of the liquid crystal polyester and thermally conductive filler. As the thermally conductive filler, 9 volume % of the first thermally conductive filler, 14 volume % of the second thermally conductive filler and 77 volume % of the second thermally conductive filler were used.

This liquid crystal polyester composition was stirred in a centrifugal deaerator for 5 minutes and then applied on a 70 μm thick copper foil so that the thickness became 200 μm. Subsequently, the copper foil was dried at 100° C. for 20 minutes and then heat-treated at 320° C. for 3 hours. Whereby, a liquid crystal polyester film 102 with a copper foil (i.e., conductive foil) 103 formed thereon was obtained.

Then, the above liquid crystal polyester film was laminated on an aluminum alloy sheet having a thermal conductivity of 140 W/(m·K) and a thickness of 2.0 mm, thereby bringing a surface (a surface on which a copper foil is not formed) of the liquid crystal polyester film into contact with the aluminum alloy sheet. These aluminum alloy sheet and liquid crystal polyester film were thermally bonded by heat-treatment under a pressure of 200 kg/cm$^2$ at a temperature of 340° C. for 20 minutes to produce an electronic circuit board.

Comparative Example 1

In the same manner as in Example 1, except that only the first thermally conductive filler was used as the thermally conductive filler, an electronic circuit board was produced.

Comparative Example 2

In the same manner as in Example 1, except that only the second thermally conductive filler was used as the thermally conductive filler, an electronic circuit board was produced.

Comparative Example 3

In the same manner as in Example 1, except that only the third thermally conductive filler was used as the thermally conductive filler, an electronic circuit board was produced.

(4) Evaluation Test

With respect to the electronic circuit boards (Example 1 and Comparative Examples 1 to 3) obtained as described above, the following evaluation tests were carried out.

A. Thermal Conductivity

Thermal conductivity was obtained by determining a thermal diffusivity, a specific heat and a density by the following methods and calculating the following equation.

$$\text{Thermal conductivity} = \text{thermal diffusivity} \times \text{specific heat} \times \text{density}$$

Herein, the thermal conductivity was measured at room temperature by a temperature wave thermal analysis method after producing samples each measuring 10 mm in length, 10 mm in width and 0.1 mm in thickness from the above respective electronic circuit boards. ai-Phase Mobile manufactured by ai-Phase Co., Ltd. was used as a measuring device.

The specific heat was determined by comparing with a sapphire standard substance using a differential scanning calorimeter (DSC).

The density was measured by the Archimedes method.

B. T-Peel Strength

In a T-peel strength test, a copper foil 103 of each electronic circuit board was etched to form a pattern having a width of 10 mm, and the strength (T-peel strength) in case of removing this copper foil pattern in a vertical direction at a rate of 50 mm/minute was measured.

C. Resistance to Soldering Heat

In a test of resistance to soldering heat, each electronic circuit board was cut into size measuring 50 mm in length and 50 mm in width and the left half of a copper foil 103 was removed (therefore, land size measures 25 mm×50 mm). Each sample was placed on a solder bath at 300° C. and then left to stand for 4 minutes. Thereafter, the sample was visually observed whether or not poor appearances such as swelling or peeling exist on the copper foil 103.

These test results are shown in Table 1.

|  | Example 1 | Comparative Example 1 | Comparative Example 2 | Comparative Example 3 |
|---|---|---|---|---|
| Thermal conductivity (W/mk) | 8.7 | 1.8 | 1.4 | 2.8 |
| Peel strength (N/cm) | 10 | 3 | 7 | 8 |
| Resistance to soldering heat (300° C. × 4 min) | No poor appearance | No poor appearance | No poor appearance | No poor appearance |

As shown in Table 1, the electronic circuit board obtained in Example 1 exhibits very high thermal conductivity such as 8.7 W/(m·K) and a T-peel strength of 10 N/cm, and poor appearance was not observed in a test of resistance to soldering heat.

The electronic circuit board obtained in Comparative Example 1 (thermally conductive filler is composed of only a first thermally conductive filler) exhibited thermal conductivity of 1.8 W/(m·K) and a T-peel strength of 3 N/cm, which are very low values as compared with Example 1. Poor appearance was not observed in the test of Resistance to soldering heat.

The electronic circuit board obtained in Comparative Example 2 (thermally conductive filler is composed of only a second thermally conductive filler) exhibited thermal conductivity of 1.4 W/(m·K) which is very low value as compared with Example 1. The T-peel strength was 7 N/cm and was lower than that of Example 1. Poor appearance was not observed in the test of Resistance to soldering heat.

The electronic circuit board obtained in Comparative Example 3 (thermally conductive filler is composed of only a third thermally conductive filler) exhibited thermal conductivity of 2.8 W/(m·K) which is very low value as compared with Example 1. The T-peel strength was 8 N/cm and was lower than that of Example 1. Poor appearance was not observed in the test of Resistance to soldering heat.

As is apparent from the above evaluation results, according to the present invention, an electronic circuit board having extremely high thermal conductivity can be obtained.

Figure 1:
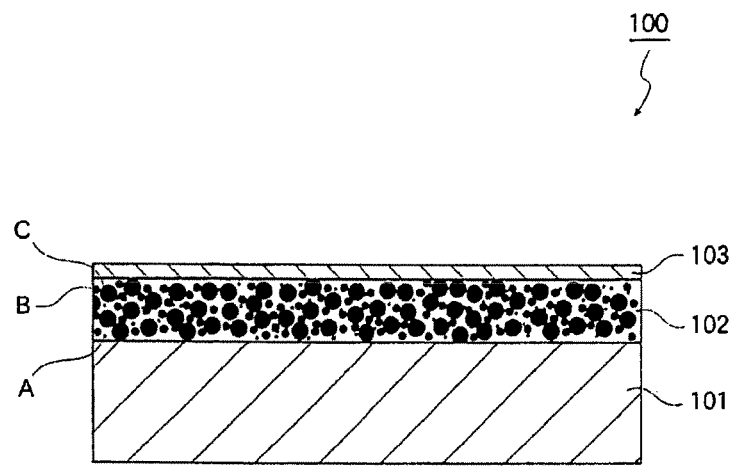
FIG. 1 is a conceptual sectional view showing a structure of an electronic circuit board according to one of embodiments of the present invention.
Figure 2:
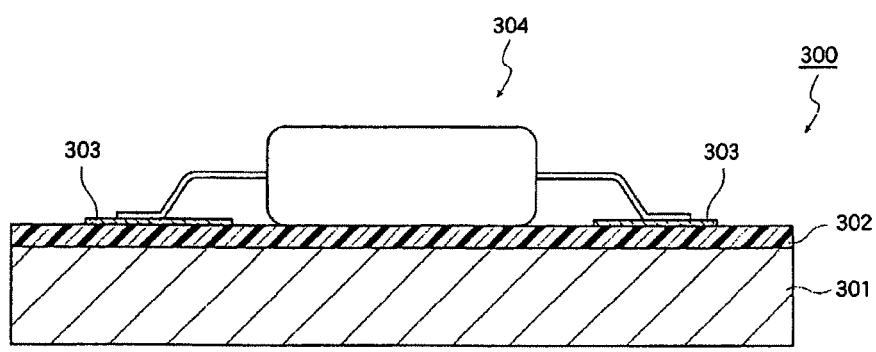
FIG. 2 is a sectional view showing a structure of a conventional electronic circuit board.

The invention claimed is:

1. A liquid crystal polyester composition comprising a liquid crystal polyester, a solvent and a thermally conductive filler, wherein the content of the thermally conductive filler is from 50 to 90 volume % based on the total amount of the liquid crystal polyester and the thermally conductive filler, and the liquid crystal polyester composition contains, as the thermally conductive filler, 0 to 20 volume % of a first thermally conductive filler having a volume average particle diameter of 0.1 μm or more and less than 1.0 μm, 5 to 40 volume % of a second thermally conductive filler having a volume average particle diameter of 1.0 μm or more and less than 5.0 μm, and 40 to 90 volume % of a third thermally conductive filler having a volume average particle diameter of 5.0 μm or more and 30.0 μm or less.

2. The liquid crystal polyester composition according to claim 1, wherein the liquid crystal polyester includes a first structural unit represented by the following formula (1), a second structural unit represented by the following formula (2) and a third structural unit represented by the following formula (3), and the content of the first structural unit is from 30 to 80 mol %, the content of the second structural unit is from 35 to 10 mol %, and the content of the third structural unit is from 35 to 10 mol %, based on the total structural units:

—O—Ar$_1$—CO—,  (1)

—CO—Ar$_2$—CO—, and  (2)

—X—Ar$_3$—Y—  (3)

wherein

Ar$_1$: 1,4-phenylene, 2,6-naphthalene or 4,4'-biphenylene,

Ar$_2$: 1,4-phenylene, 1,3-phenylene or 2,6-naphthalene,

Ar$_3$: 1,4-phenylene or 1,3-phenylene,

X: —NH—, and

Y: —O— or —NH—.

3. The liquid crystal polyester composition according to claim 1, wherein a part or all of the thermally conductive filler is an aluminum oxide powder.

4. The liquid crystal polyester composition according to claim 1, wherein a part or all of the thermally conductive filler is an aluminum nitride powder.

5. An electronic circuit board comprising a substrate for heat radiation, an insulating film provided on the substrate for heat radiation and a conductive foil for formation of a wiring pattern provided on the insulating film, wherein the insulating film is a film formed by removing a solvent from a cast of the liquid crystal polyester composition according to claim 1.

6. The electronic circuit board according to claim 5, wherein thermal conductivity of the insulating film is from 6 to 20 W/(m·K).

* * * * *